(12) United States Patent
Winkler et al.

(10) Patent No.: US 8,560,140 B2
(45) Date of Patent: Oct. 15, 2013

(54) HOME APPLIANCE AND METHOD FOR OPERATING A HOME APPLIANCE

(75) Inventors: Ralf Winkler, New Bern, NC (US); Christian Wolf, New Bern, NC (US)

(73) Assignee: BSH Home Appliances Corporation, Irvine, CA (US)

( * ) Notice: Subject to any disclaimer, the term of this patent is extended or adjusted under 35 U.S.C. 154(b) by 284 days.

(21) Appl. No.: 12/642,906

(22) Filed: Dec. 21, 2009

(65) Prior Publication Data

US 2011/0153105 A1    Jun. 23, 2011

(51) Int. Cl.
*G06F 19/00* (2011.01)

(52) U.S. Cl.
USPC .......................................... 700/298; 700/295

(58) Field of Classification Search
USPC ................................. 700/295, 298
See application file for complete search history.

(56) References Cited

U.S. PATENT DOCUMENTS

| | | | |
|---|---|---|---|
| 7,110,836 B2* | 9/2006 | Sturm et al. .................... | 700/83 |
| 7,112,891 B2 | 9/2006 | Johnson et al. | |
| 7,208,697 B2* | 4/2007 | Blankenship et al. ... | 219/130.21 |
| 7,274,975 B2* | 9/2007 | Miller ........................... | 700/295 |
| 7,343,506 B1 | 3/2008 | Fenwick | |
| 7,504,749 B2* | 3/2009 | Von Seidel .................... | 307/131 |
| 7,514,815 B2 | 4/2009 | Paik et al. | |
| 7,783,390 B2* | 8/2010 | Miller .......................... | 700/291 |
| 2003/0009265 A1* | 1/2003 | Edwin .......................... | 700/295 |
| 2003/0225483 A1* | 12/2003 | Santinato et al. ............. | 700/295 |
| 2004/0024483 A1* | 2/2004 | Holcombe .................... | 700/122 |
| 2007/0271006 A1* | 11/2007 | Golden et al. ................ | 700/295 |
| 2008/0125101 A1* | 5/2008 | Bakos et al. .................. | 455/418 |
| 2008/0278003 A1 | 11/2008 | Pouchet et al. | |
| 2009/0039797 A1 | 2/2009 | Wang et al. | |
| 2009/0098832 A1 | 4/2009 | Johnson | |
| 2009/0178348 A1* | 7/2009 | Flaherty ........................ | 52/81.1 |
| 2009/0179495 A1 | 7/2009 | Yeh | |
| 2009/0224681 A1 | 9/2009 | Bassford et al. | |
| 2009/0234513 A1* | 9/2009 | Wiggins ....................... | 700/300 |
| 2009/0301687 A1* | 12/2009 | Watts ........................... | 165/48.2 |
| 2010/0070091 A1* | 3/2010 | Watson et al. ................ | 700/278 |
| 2010/0175719 A1* | 7/2010 | Finch et al. ................... | 134/18 |
| 2010/0179708 A1* | 7/2010 | Watson et al. ................ | 700/296 |
| 2010/0194524 A1* | 8/2010 | Campero ...................... | 340/3.1 |

FOREIGN PATENT DOCUMENTS

DE    10057263 A1    5/2002

OTHER PUBLICATIONS

"The Solar House in Freiburg", Fraunhofer Institute Solar Energy Systems, Aug. 2000.*
"ThermoMax" Renewables, Kingspan Solar, Oct. 2009.*
"Introducing Sunny, the new washing machine works with solar-heated water", Electrolux press release, Mar. 2008.*
"Increasing solar gains by using hot water to heat dishwashers and washing machiens", Persson et al, Elsevier Applied Thermal Engineering, Jul. 2006.*
Renewable Energy Mills, http://www.renewableenergymills.com/index.html, Accessed online: Oct. 6, 2009.

* cited by examiner

*Primary Examiner* — Michael D Masinick
(74) *Attorney, Agent, or Firm* — James E. Howard; Andre Pallapies

(57) ABSTRACT

A home appliance includes an electronic controller with a trigger port which starts an operating cycle for the home appliance in response to a signal received on the trigger port that indicates availability of an alternative resource.

14 Claims, 3 Drawing Sheets

HOME APPLIANCE AND METHOD FOR OPERATING A HOME APPLIANCE

FIELD OF THE INVENTION

The invention relates to a home appliance and to a method for operating a home appliance

DESCRIPTION OF THE RELATED ART

Home appliances may utilize alternative resources. Published German application for patent No. 100 57 263 A1, for instance, discloses a water-utilizing home appliance which comprises cold water and warm water inlets. Water for the warm water inlet may be heated by solar collectors.

SUMMARY OF THE INVENTION

It is an object of an exemplary embodiment of the present invention to provide a method for operating a home appliance which enables more efficient usage of an alternative resource when operating the home appliance.

An exemplary embodiment of the present invention is a method for operating a home appliance, which includes preparing a home appliance to be ready to start an operating cycle, automatically detecting when an alternative resource useful for the operating cycle is available, and automatically starting the home appliance to perform the operating cycle utilizing the alternative resource in response to detecting the availability of the alternative resource.

Another aspect of the invention is directed to a home appliance, that includes an electronic controller which is configured to control an operating cycle of the home appliance and comprises a trigger port, the electronic controller being configured to automatically start the operating cycle utilizing an alternative resource useful for the operating cycle as soon as the trigger port receives a signal indicating that the alternative resource is available.

According to an exemplary embodiment of the invention, the home appliance can be operated utilizing the alternative resource. An alternative resource may be, for instance, electric power generated by an alternative or "green" power source or water heated by an alternative or "green" heating system. An example of an alternative power source is a photovoltaic system.

Alternative or "green" resources have the advantage that they are environmentally friendlier compared to conventional resources such as electric power generated by thermal power plants or water heated by conventional sources. Alternative resources may, however, not be available constantly, potentially abating usability of home appliances based on alternative resources. Since according to the inventive method or to the inventive home appliance the home appliance starts automatically after having been prepared for its operating cycle and as soon as its alternative resource is available, an operator can basically use the inventive home appliance as a conventional home appliance in terms of usability, i.e., for instance, load the inventive home appliance in a conventional manner, and does not need to be concerned about when the alternative resource is available.

The inventive home appliance may be a water-utilizing home appliance, for instance, a dish washing machine or a washing machine. Then, the operating cycle is a dishwashing or washing cycle and preparing the inventive home appliance may include loading the dish-washer with dirty dishes or loading the washing machine with dirty cloths and adding the necessary detergent for the cleaning cycle.

The alternative resource may be electric power generated by an alternative electric power source. Then, the inventive home appliance may be configured to start the operating cycle as soon as the electric power from the electric power source is available by powering the home appliance utilizing the energy of the alternative power source. The electric power source may, for instance, be a photovoltaic power source. Then, the inventive home appliance runs only if having been prepared for the operating cycle and if and when the photovoltaic system, in general the alternative power source, generates alternative electric power needed to run the inventive home appliance.

The signal indicating that the alternative electric power is available and that the inventive home appliance can automatically start its operating cycle may be indicative of operation of a voltage converter which is part of a photovoltaic system. Photovoltaic systems convert light into electricity utilizing solar cells. The electricity generated by the solar cells is converted, for instance, into an ac-voltage utilizing appropriate converters generally known in the art. As soon as the converter operates, it can be assumed that the photovoltaic system generates alternative electric power. Thus, if the signal indicates operation of the converter, it also indicates that the respective alternative energy is available, justifying starting the inventive home appliance automatically.

As mentioned above, the inventive home appliance may be a water-utilizing home appliance. Then the alternative resource may be water heated by a solar heater, and the home appliance, particularly its electronic controller may be configured to start the operating cycle utilizing the water heated by the solar heater as soon as the signal received by the home appliance, particularly by the trigger port indicates that water heated by the solar heater is available. Dishwashing or washing machines may be designed, so that the water is already heated before entering the machine. Heating the water utilizing a solar heater may reduce pollution compared to that heated by conventional sources. Solar heaters may comprise a thermodynamic collector with a heat transfer fluid flowing through it to transport the heat energy to, for instance, a hot water tank. Generally, such systems use the heat of the sun to heat the water. Thus, if the operation cycle is automatically postponed until water heated by the solar heater is available then a more energy efficient operation of the inventive home appliance can be achieved.

Solar heaters may include a circulation pump particularly adapted to pump the water to the water tank. In one embodiment of the inventive house appliance, the signal used to start the appliance is indicative of operation of a circulation pump which is part of the solar heater. Thus, it is possible to reliably detect when heated water from the solar heater is available for the operating cycle.

Depending on the specific embodiment, the invention provides an external trigger of home appliances for use of "green energy". Operating appliances is more cost effective or environmentally friendly if they are only activated when alternative energy or an alternative resource is available. The invention may provide a relatively simple trigger port in the appliance's electronics particularly only handling the information: "green energy available/green resource" available=Yes/No. This information is provided by another system, for instance, connected to the power-supply of the circulation pump of a solar heater. Therefore it is evident when, for instance, solar heated water useful for operating the home appliance is available.

Using an exemplary embodiment of the inventive home appliance, an operator only needs to prepare the appliance and start the operation. The actual start of the appliance is controlled by the trigger port. If the alternative energy (generally: alternative resource) is currently available, for instance, during a sunny day, the home appliance starts immediately; otherwise the start is automatically delayed until the alternative resource is available. This feature may also be implemented as an optional feature, and may be, for instance, chosen by the operator.

An advantage of an exemplary embodiment of the inventive method or the inventive home appliance is its relatively simple implementation. There are no bus protocols or professionals for installing necessary. It may cooperate with a wide range of appliances and no standards are needed. For the trigger port, virtually every on-off output may provide an appropriate source for the trigger signal. For instance, the activation of the circulation pump of a solar-water-heating system may indicate that hot water for the operating cycle is available, triggering to start the appliance. Also the "active" indicator of the voltage converter of solar-cells is a possible source.

Depending on the embodiment, the invention provides a home appliance with a trigger port. The trigger port may receive a trigger signal which may be a pulse. The trigger signal originates from an external system, for instance, a solar power converter, electronics of a solar heated water reservoir, or an intelligent home control system.

BRIEF DESCRIPTION OF THE DRAWINGS

The invention will be described in greater detail hereafter, by way of non-limiting examples, with reference to the embodiments shown in the drawings.

DESCRIPTION OF EMBODIMENTS

Figure 1:
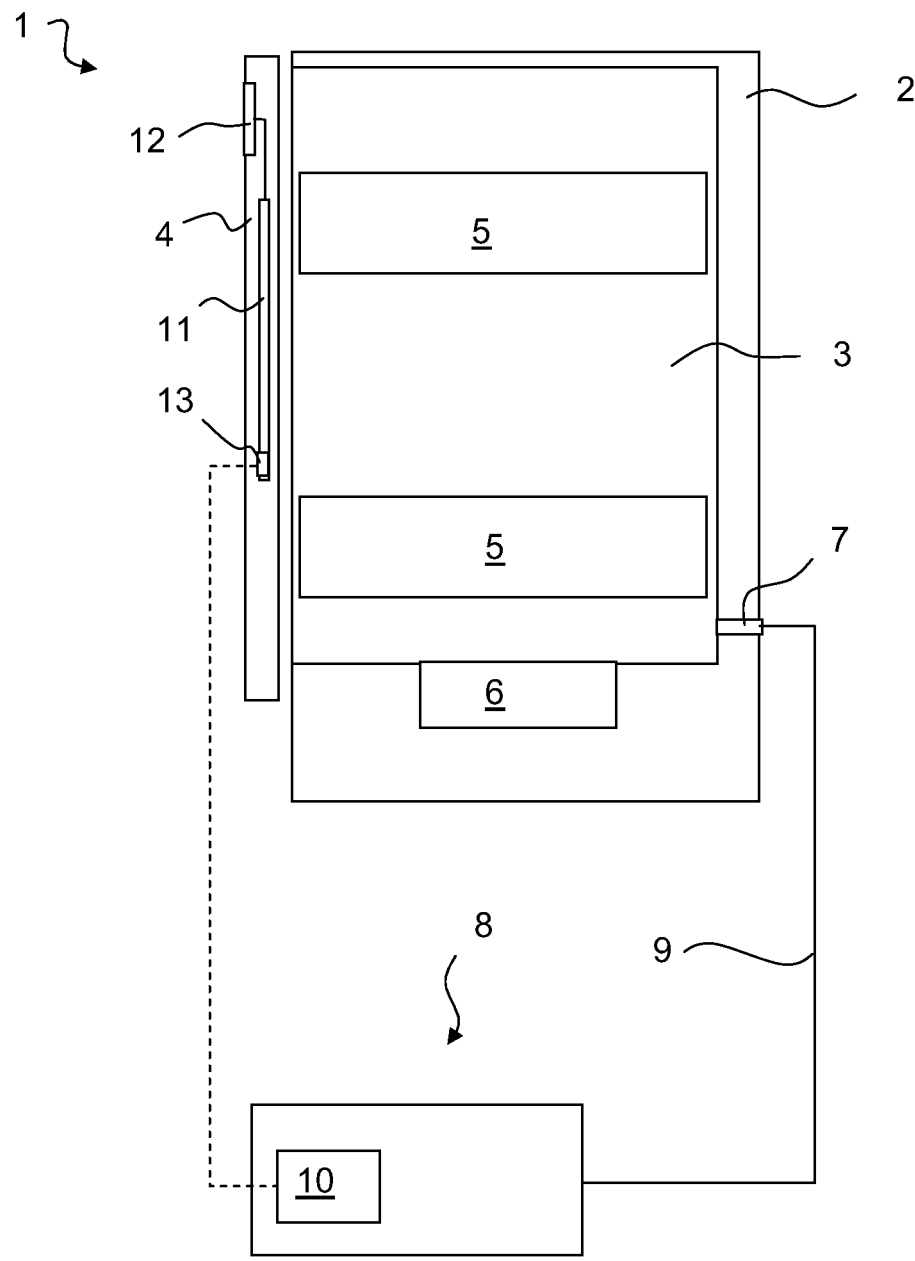
FIG. 1 is a home appliance.

FIG. 1 depicts a dishwasher 1 as an example of a water-utilizing home appliance, or in general as an example of a home appliance. Another example of a water-utilizing home appliance is a washing machine.

The dishwasher 1 includes a body 2 housing a washing container 3 which can be opened and closed by a door 4 hinged at the body 2. The washing container 3 may accept a dish basket 5 adapted to accept dirty cutlery and dishes to be cleaned during an operating cycle, particularly during a cleaning cycle performed by the dishwasher 1.

The dishwasher 1 further includes a water circulator 6 for circulating water with a detergent for cleaning the dirty dishes and cutlery during the cleaning cycle. The dishwasher 1 also includes a water inlet 7 which is connected to a solar water heater 8 via a water pipe 9. Solar heaters in general are known in the art and are used to heat water utilizing solar energy, particularly the heat of the sun. Solar heaters use sun radiation to heat water either directly or indirectly, particularly utilizing thermodynamic collectors. A solar heater may include a solar panel or solar collector with a heat transfer fluid flowing through it to transport the heat energy collected to heat, for instance, water tank of the solar heater not explicitly shown in the figures. For the example shown, the solar heater 8 includes a circulation pump 10, for instance, to circulate the fluid of the solar heater.

In order to control the cleaning cycle, the dishwasher 1 includes an electronic controller 11 which may, for instance, include a micro-processor or micro-controller programmed to control the water circulator 6 for circulating water and the water inlet 7. The controller 11, which is arranged inside the door 4 for the example shown, is connected to a control panel 12 located on the outside surface of the door 4.

The control panel 12 may include a manual control interface, for instance, buttons or knobs for setting a specific cleaning cycle chosen by an operator not explicitly shown in the figures. In response to the set cleaning cycle, the controller 11 may automatically start a chosen cleaning cycle.

For the exemplary embodiment shown, the controller 11 further comprises a trigger port 13. The trigger port 13 is an interface which can be connected to an external trigger source and is configured to receive a trigger signal sent from a trigger source. Particularly, the trigger port 13 and the controller 11 are configured to only start the cleaning operation, if the trigger port 13 receives the trigger signal. Otherwise, starting of the cleaning cycle is delayed until the trigger port 13 receives the trigger signal.

For the exemplary embodiment, this external source is associated with the solar heater 8 such that the controller 11 only starts the cleaning cycle if the solar heater 8 can provide warm water for the dishwasher 1. Particularly, the trigger port 13 is connected to the circulation pump 10 of the solar heater 8. The circulation pump 10 is configured to send an "on" signal as soon and preferably while it is operating. This "on" signal is the trigger signal for the dishwasher 1.

Figure 2:
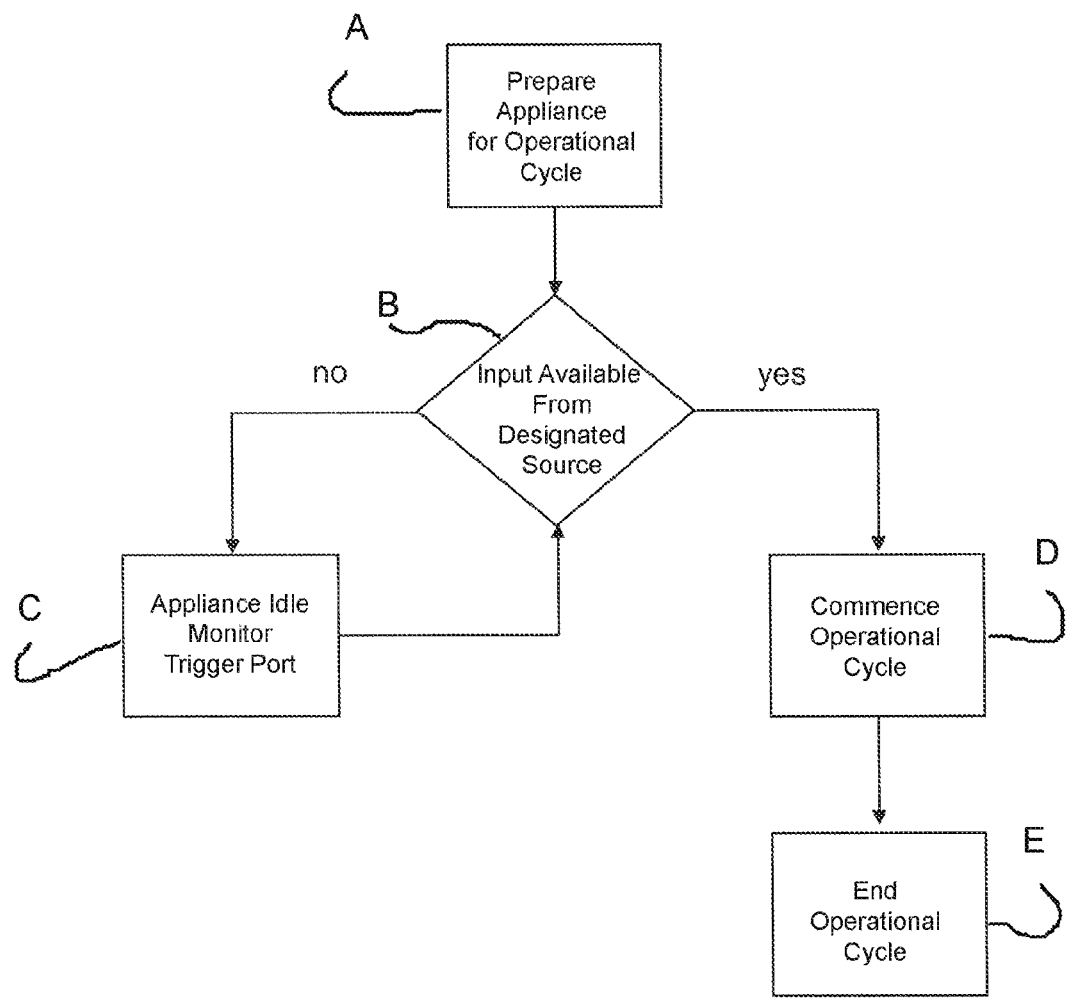
FIG. 2 is a flow chart illustration of the operation of the home appliance and FIG. 3 is a photovoltaic system.

FIG. 2 shows a flow chart illustrating the operation of the dishwasher 1. At step A, the operator prepares the dishwasher 1, i.e. he/she loads the dishwasher 1 with dirty cutlery and/or dishes, adds an appropriate detergent and sets the dishwasher 1 into a state that it can start automatically. The latter is performed, for instance, by activating the manual control interface. Thus, the dishwasher 1 is ready to perform the set cleaning cycle.

Then, at step B, the controller 11 checks if warm water from the solar heater 8 is available by monitoring its trigger port 13 ("alternative resource available? Yes/No"). As long as the trigger signal being present at the trigger port 13 is off or "low", the circulation pump 10 is turned off or is not operating, and thus no alternative resource, particularly warm water heated by the solar heater 1, is available. During this time, the controller 11 does not start the cleaning cycle and sets the dishwasher 1 into an idle status, step C.

As soon as the circulation pump 10 starts working, the trigger signal turns "high", indicating that water heated by the solar heater 8 is available. The controller 11 recognizes this piece of information and automatically starts the prepared dishwasher 1 according to the set cleaning cycle and utilizing the water heated by the solar heater 8, step D, until the cleaning cycle is finished, step E.

Figure 3:
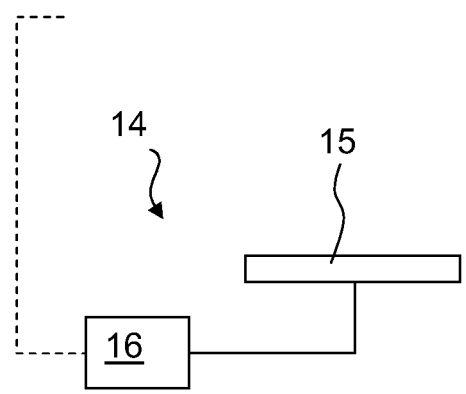

FIG. 1 shows an example of an alternative resource in the form of water heated by an alternative or "green" heating system namely the solar heater 8. FIG. 3 shows a photovoltaic system 14 as an example of an electric power source generating alternative or "green" electric power.

The photovoltaic system 14 includes, for instance, solar cells 15 configured to convert light into electricity as it is general known in the art. The electricity generated by the solar cells 15 is converted into a three-phase or ac-voltage utilizing a converter 16 also generally known in the art. The operation of the converter 16 indicates if the photovoltaic system 15 generated electricity, i.e. if alternative or "green" energy is available.

Thus, the dishwasher 1, or in general a home appliance which has been prepared to start an operating cycle, such as the cleaning cycle, automatically starts the operating cycle as soon as it receives at its trigger input 13, which then is connected to the converter 16 of the photovoltaic system 14, the information that the converter 16 is running. Then, the home appliance, such as the dishwasher 1, performs the operating cycle utilizing the alternative energy generated by the photovoltaic system 14.

Although modifications and changes may be suggested by those skilled in the art, it is the intention of the inventors to embody within the patent warranted hereon all changes and modifications as reasonably and properly come within the scope of their contribution to the art.

What is claimed is:

1. A home appliance operable with at least one primary utility resource and at least one secondary utility resource, the secondary utility resource being at least one of heated water and electricity, the home appliance comprising:
   an electronic controller with a selectively operable trigger port which detects a trigger signal produced by a device operatively associated with the secondary utility resource, the trigger signal being low when the device operatively associated with the secondary utility resource is nonoperational and the secondary utility resource is unavailable for use by the home appliance, and the trigger signal being high when the device operatively associated with the secondary utility resource is operational and the secondary utility resource is available for use by the home appliance, wherein the electronic controller starts an operating cycle for the home appliance in response to the trigger port detecting a high trigger signal.

2. The appliance of claim 1, wherein the secondary utility resource comprises electric power generated by an alternative electric power source and the electronic controller starts the operating cycle in response to the trigger signal received on the trigger port wherein the operating cycle of the home appliance uses the electrical power of the alternative electric power source.

3. The appliance of claim 1, wherein the trigger signal is from the operation of a voltage converter of a photovoltaic system.

4. The appliance of claim 1, wherein the home appliance comprises a water-utilizing home appliance, the secondary utility resource includes water heated by a solar heater having a water circulation pump, and the electronic controller starts the operating cycle utilizing the water heated by the solar heater in response to the trigger signal received by the trigger port that indicates that the water circulation pump is operating.

5. The appliance of claim 1, wherein the water-utilizing home appliance comprises at least one of a dish-washer machine and a washing machine.

6. The appliance of claim 1, wherein the home appliance includes a water-utilizing home appliance, the secondary utility resource includes at least one of water heated by a solar heater having a water circulation pump and electricity produced by a photovoltaic system having a voltage converter, and the electronic controller starts the operating cycle utilizing at least one of the water heated by the solar heater in response to a high trigger signal being detected by the trigger port, the trigger signal being produced by operation of the water circulation pump and electricity produced by the photovoltaic system in response to a high trigger signal being detected by the trigger port, the trigger signal being produced by operation of the voltage converter.

7. The appliance of claim 1, wherein the home appliance includes a water-utilizing home appliance, the secondary utility resource includes at least one of water heated by a solar heater and electricity produced by a photovoltaic system, and the device operatively associated with the secondary utility resource includes at least one of a water pump operatively associated with the solar heater and a voltage converter operatively associated with the photovoltaic system.

8. A method for operating a home appliance operable with at least one primary utility resource and at least one secondary utility resource, the secondary utility resource being at least one of heated water and electricity, the method comprising:
   preparing the home appliance to be ready to start an operating cycle;
   detecting a trigger signal produced by a device operatively associated with the secondary utility resource, the trigger signal being low when the device operatively associated with the secondary utility resource is nonoperational and the secondary utility resource is unavailable for use by the home appliance, and the trigger signal being high when the device operatively associated with the secondary utility resource is operational and the secondary utility resource is available for use by the home appliance; and
   starting an operating cycle for the home appliance using an electronic controller in response to detecting a high trigger signal using the trigger port.

9. The method of claim 8, wherein the secondary utility resource includes electric power generated by an alternative electric power source, and starting of the home appliance further comprises starting the operating cycle as soon as electric power from the electric power source is available by powering the home appliance utilizing the energy of the alternative power source.

10. The method of claim 9, wherein the step of detecting further comprises detecting a signal that indicates of operation of a voltage converter of a photovoltaic system.

11. The method of claim 8, wherein the home appliance comprises a water-utilizing home appliance and the secondary utility resource includes water heated by a solar heater, wherein starting further comprises starting the operating cycle as soon as the water heated by the solar heater is available and utilizing the heated water during the operating cycle.

12. The method of claim 11, wherein the step of detecting further comprises detecting when the water heated by the solar heater is available by detecting a signal being indicative of operation of a circulation pump which is part of the solar heater.

13. The method of claim 8, wherein the home appliance includes a water-utilizing home appliance and the secondary utility resource includes at least one of water heated by a solar heater and electricity produced by a photovoltaic system, wherein detecting includes starting the operating cycle when at least one of the water heated by the solar heater and electricity produced by the photovoltaic system is available and utilizing at least one of the heated water and the electricity during the operating cycle.

14. The method of claim 8, wherein the home appliance includes a water-utilizing home appliance and the secondary utility resource includes at least one of water heated by a solar heater and electricity produced by a photovoltaic system, and detecting includes detecting the trigger signal, the trigger signal being produced automatically when the secondary utility resource becomes available, and wherein the device operatively associated with the secondary utility resource includes at least one of a water pump operatively associated with the solar heater and a voltage converter operatively associated with the photovoltaic system.

* * * * *